US006717385B2

(12) United States Patent
Asada et al.

(10) Patent No.: US 6,717,385 B2
(45) Date of Patent: Apr. 6, 2004

(54) VOLTAGE REGULATOR OF VEHICLE AC GENERATOR

(75) Inventors: Tadatoshi Asada, Anjo (JP); Kazuyuki Watanabe, Kariya (JP)

(73) Assignee: Denso Corporation, Kariya (JP)

( * ) Notice: Subject to any disclaimer, the term of this patent is extended or adjusted under 35 U.S.C. 154(b) by 63 days.

(21) Appl. No.: 09/922,918

(22) Filed: Aug. 7, 2001

(65) Prior Publication Data
US 2002/0047691 A1 Apr. 25, 2002

(30) Foreign Application Priority Data
Aug. 7, 2000 (JP) ........................................ 2000-238621

(51) Int. Cl.⁷ .......................... H02H 7/06; H02P 11/00; H02P 4/00
(52) U.S. Cl. .......................... 322/24; 322/26; 322/28
(58) Field of Search .............................. 322/24, 26, 28

(56) References Cited

U.S. PATENT DOCUMENTS

| 4,831,322 A | * | 5/1989 | Mashino et al. | 322/28 |
| 5,424,594 A | | 6/1995 | Saito et al. | 310/68 D |
| 5,497,071 A | * | 3/1996 | Iwatani et al. | 322/28 |
| 5,610,499 A | * | 3/1997 | Rogers | 322/25 |
| 5,629,606 A | * | 5/1997 | Asada | 322/28 |
| 5,675,237 A | * | 10/1997 | Iwatani | 322/28 |
| 5,737,199 A | * | 4/1998 | Kanamori et al. | 363/56.03 |
| 5,886,500 A | * | 3/1999 | Iwatani et al. | 320/104 |
| 5,936,440 A | * | 8/1999 | Asada et al. | 327/110 |
| 6,014,016 A | * | 1/2000 | Maruyama et al. | 322/28 |
| 6,344,734 B1 | * | 2/2002 | Iwatani et al. | 322/28 |
| 6,462,517 B2 | * | 10/2002 | Asada | 322/28 |

FOREIGN PATENT DOCUMENTS

| DE | 19755653 | 7/1998 |
| DE | WO 00/27032 | 5/2000 |
| EP | 0 678983 A1 | 10/1995 |
| GB | 2318467 | 4/1998 |
| JP | 06022470 | 1/1994 |
| JP | 2529273 | 6/1996 |
| JP | 3019377 | 1/2000 |

OTHER PUBLICATIONS

H.P. Yee, Ph.D., An EMI Suppression MOSFET Driver, IEEE, 1997, pp. 242–248.

* cited by examiner

Primary Examiner—Tran Nguyen
Assistant Examiner—Julio C. Gonzalez
(74) Attorney, Agent, or Firm—Oliff & Berridge, PLC

(57) ABSTRACT

A voltage regulator is comprised of a semiconductor element for controlling current supplied to a field coil, a flywheel element, a generation voltage regulation circuit for controlling the semiconductor element, and a switching capacity control circuit for controlling a current-switching capacity during a former stage of a turn-off transition period of the semiconductor element to be larger than that during the latter stage of the turn-off transition period. Accordingly, the current change rate can be reduced, so that surge voltage and electro-magnetic wave can be reduced.

5 Claims, 6 Drawing Sheets

VOLTAGE REGULATOR OF VEHICLE AC GENERATOR

CROSS REFERENCE TO RELATED APPLICATION

The present application is based on and claims priority from Japanese Patent Application 2000-238621 filed Aug. 7, 2000, the contents of which are incorporated herein by reference.

BACKGROUND OF THE INVENTION

1. Field of the Invention

The present invention relates to a voltage regulator of a vehicle AC generator for controlling current supplied to a field coil of the generator by a semiconductor element.

2. Description of the Related Art

Japanese patent publications P2529237 and P3019377, which was filed by this applicant, disclose arts (hereinafter referred to as the turn-off moderation technology) for reducing electromagnetic noises caused by inductance of a power line that connects a semiconductor elements and a battery when the semiconductor element is turned off to cut current supplied to a field coil.

In this turn-off moderation technology, the control voltage or a switching capacity of the semiconductor element is changed at a constant rate so that current-reduction rate of the semiconductor element can be made smaller than the current-reduction rate of the semiconductor element whose control voltage is changed stepwise.

However, the disclosed turn-off moderation technology, a large amount of internal loss may be caused during turnoff transition period of the semiconductor element if the current reduction rate lowers. Since it is necessary to increase the surface area of the semiconductor element and to improve the cooling structure thereof, such turn-off moderation technology has not been put into practice.

In particular, a large amount of heat is generated during the former stage of the turn-off transition period due to a large inductance of the field coil.

SUMMARY OF THE INVENTION

The present invention has been made in view of the above stated problem of the conventional technology.

Therefore, a main object of the invention is to provide a voltage regulator of a vehicle AC generator, in which heat generated by a semiconductor element when current supplied to the field coil is reduced and noises are suppressed.

A voltage regulator of a vehicle AC generator according to a feature of the invention is comprised of a semiconductor element for controlling current supplied to a field coil of the AC generator, a flywheel element connected in parallel with the field coil, a voltage regulating circuit that controls the semiconductor element to turn on or off, and a switching capacity control circuit for controlling a current-switching capacity of the switching element during a former stage of a turn-off transition period of the semiconductor element to be larger than that during the latter stage of the turn-off transition period.

Accordingly, comparing with an ordinary turn-off operation that reduces current switching capacity stepwise during the former stage of the turn-off transition period, the current change rate between the main electrodes can be reduced to be less thereby to increase a period for reducing the turn-on current of the semiconductor element to zero, so that surge voltage and electromagnetic wave, which are proportional to current change rate, can be reduced.

Comparing a conventional turn-off moderation technology that maintains the switching capacity reduction rate (which is the same as the current reduction rate of the semiconductor element) constant from the former stage to the last stage of the turn-off transition period, the necessary turn-off transition period can be shortened. Therefore, not only heat generation can be reduced but also frequency components of electromagnetic noises that are inversely proportional to the turn-off transition period can be changed. As a result, electromagnetic noises that are harmful to electronically controlled on-vehicle devices can be suppressed.

In order to change the current of the semiconductor element from a turn-on current to zero in an ideal step shape, the surge voltage of the battery power line is related to a product of the differentiated value of current change and wire inductance of battery power line. The magnitude of the surge voltage becomes larger as the frequency increases. On the other hand, AC impedance ($1/j\omega c$) at the space around the battery power line for each frequency component of the surge voltage decreases as the frequency increases. Therefore, the magnitude of the electromagnetic noises radiated outward from the battery power line when the semiconductor element turns off increases in proportion to a square of the frequency. Thus, the magnitude of the electromagnetic noises becomes much larger when the current of the semiconductor element is turned off stepwise. However, since the turn-off transition period is very short, heat generation during the turn-off transition period is very small.

If the current switching capacity, which depends on voltage applied to a control gate of the semiconductor element, is reduced at a fixed reduction rate, the current reduction rate during the turn-off transition period decreases in inverse proportion to increase in the turn-off transition period. Therefore, the electromagnetic noises can be very much reduced. However, the heat generation by the semiconductor element during the turn-off transition period increases that much.

According to this feature, a medium characteristic of both turn-off technologies can be provided, so that the electromagnetic noises can be suppressed without large heat generation.

In other words, the electromagnetic noises generated during the turn-off transition period are suppressed much more than the case of the stepwise change, and mean value of the current during the turn-off transition period and the length of the turn-off transition period can be reduced to less than the turn-off moderation technology.

Moreover, according to this feature, increase in the electromagnetic noises can be effectively suppressed, as described below, although the current switching capacity is reduced during the former stage of the turn-off transition period, and although the current does not decrease very much and the voltage drop across the main electrodes of the semiconductor element is very large, which otherwise causes large heat because of the accumulated magnetic energy of the field coil.

According to another feature of the invention, the drive means changes control voltage or control current of the semiconductor element at an approximately fixed change rate during the former stage of the turn-off transition period and the latter stage, and the change rate at the former stage is set larger than the change rate at the latter stage.

According to this feature, the current switching capacity can be changed by a simple circuit. In the meantime, the control voltage or the control current is the potential or the current of the control gate of the semiconductor element.

According to another feature of the invention, the semiconductor element carries out a follower operation. The follower operation is operation of a circuit in which the field coil and the flywheel diode are connected to the source electrode or the emitter electrode.

In case of the N-channel MOSFET, because the inductance of the field coil in a source follower circuit is very large, when the gate voltage of the semiconductor element decreases during the former stage of the turn-off transition period, magnetic energy of the field coil is discharged to maintain the current supplied to the field coil, thereby lowering the potential of the source electrode.

The reduction of the source voltage suppresses the current change of the semiconductor element, because the channel current of the N-channel MOSFET is proportional to a square of the voltage Vgs between the gate and the source in the saturation range. On the other hand, reduction of the source electrode potential causes increase in voltage effect of the N-channel MOSFET or the semiconductor element and in heat generation.

At the former stage of the turn-off transition period, although the current switching capacity of the semiconductor element decreases due to decrease in the gate electrode potential, current flows in the semiconductor element to restrict the current change due to discharge of the magnetic energy. Thus, the channel current becomes large during the former stage of the turn-off transition period, and the voltage drop becomes large and heat generation becomes large at the semiconductor.

In the former stage of the turn-off transition period during which the source electrode potential of the semiconductor element changes from a high power source voltage to a low power source voltage, magnetic energy of the field coil is discharged. Therefore, change in the channel current is small, the current reduction rate is small, and the electromagnetic noises are small although, as stated above, the absolute value of the current is large and heat generation is large. Therefore, it is preferable to lower the gate electrode voltage, i.e. the control voltage as quickly as possible, thereby to shift to the next current reduction process.

Even if the quick shifting is carried out and the gate potential of the source follower N-channel MOSFET is quickly lowered, the electromagnetic noises will not increase very much since the current change at the former stage is small as stated above.

If the source electrode potential of the semiconductor element becomes about −0.7 V or 0.7 V lower than the low power voltage or a ground voltage, return current is supplied from the flywheel diode to the source electrode of the N-channel MOSFET (semiconductor element). Consequently, the channel current of the N-channel MOSFET corresponding to the sum of the amount of the return current and loss of the magnetic energy decreases as the control voltage decreases. This decrease in the channel current causes the electromagnetic noises. Therefore, it is preferable that the reduction rate of the control voltage or reduction rate of the current switching capacity of the N-channel MOSFET is controlled to reduce the electromagnetic noises. As a result, increase in the electro-magnetic noises and heat generation can be controlled. The above explanation is given as to the source follower operation. However, it can be given as to the emitter follower operation in substantially the same manner. A source-grounded operation is also similar to the above.

In a circuit in which the drain electrode or the collector electrode is connected to the field coil and the flywheel diode, if the gate electrode potential is lowered to lower the current switching capacity of the transistor, the field coil discharges magnetic energy in the form of current in order to maintain the current as it has been. Consequently, the drain electrode potential increases quickly.

The increase in the drain electrode potential means the increase in the voltage drop across the main electrodes of the semiconductor element by a large amount of the channel current. Therefore, the heat generation of the semiconductor element or the product of channel current and the voltage drop sharply increases. The increase in the drain electrode potential further increases channel current because of increase in the drain's depletion layer in the channel region.

In summary, in the source-grounded circuit, it is also necessary to quickly lower the control voltage (gate electrode voltage) or the current switching capacity of the semiconductor, thereby stopping a large amount of heat generation during the former stage of the turn-off transition period in which the current change becomes smaller.

If the drain electrode potential becomes 0.7 V or more higher than the higher power voltage, return current flows through the flywheel diode so that the drain electrode potential can be prevented from rising further. At the same time, the channel current decreases by the amount corresponding to the sum of the return current and the loss of the magnetic energy. Therefore, the reduction rate of the current switching capacity is reduced to suppress the electromagnetic noises that are generated in proportion to this reduction rate.

According to another feature of the invention, the voltage regulator further includes a comparator for comparing a signal voltage related to a voltage drop of main electrodes of the semiconductor element with a reference value, wherein the drive means decreases a decrease rate of current switching capacity of the control electrode of the semiconductor element to a smaller value right after the signal voltage becomes the reference value during the turn-off transition period.

Thus, it is possible to detect the former stage of the turn-off transition period in which the current reduction rate is to increase and the latter stage of the turn-off transition period in which the current reduction rate is decrea.

The signal voltage is any one of the voltage at the joint of the semiconductor element and the field coil, the voltage drop across the main electrodes of the semiconductor element, the voltage drop by the field coil, the current flowing through the main electrodes of the semiconductor element, the current of the flywheel element and the current of the field coil. In particular, the return current is more preferable because the return current detected in the source follower circuit or the emitter follower circuit means start of the reduction in the current of the semiconductor element.

According to another feature of the invention, the comparator increases charging current of the gate electrode of the semiconductor element, right after the signal voltage becomes the reference value during the turn-on transition period of the semiconductor element; and the reference value for changing the charging current during the turn-on transition period is set higher than a predetermined value for changing the charging current during the turn-off transition period.

Even if the detection of the signal voltage delays, the control voltage applied to the semiconductor element does not lower quickly to turn off the semiconductor element immediately. Therefore, the change speed of the current flowing through the semiconductor element can be gradually lowered, so that the spike voltage and radio noises can be reduced effectively.

According to another feature of the invention, a voltage regulator of a vehicle AC generator is comprised of a semiconductor element for controlling current supplied to a field coil, a flywheel element connected in parallel with the field coil, generation voltage regulating circuit for controlling the semiconductor element to turn on or off so that an output voltage of the regulator can be regulated to a predetermined control voltage according to a signal that is related to the output voltage, switching capacity control circuit including a charge pump voltage boosting circuit that supplies the semiconductor element operating follower operation with a higher gate voltage than the output voltage, and an operation control circuit for stopping the charge pump circuit from a former stage of turn-off transition period of the semiconductor element.

According to this feature, the driving current of the charge pump circuit and the accompanied noises thereof and the noises of the AC generator can be reduced. The charge pump boosting circuit can be stopped during the turn-off transition period and the post cut-off state maintaining period. In addition, it can be stopped while the semiconductor element fully turns on and the voltage across the main electrodes thereof is low, with the same effect.

By the charge pump circuit, excessive electric charge is not charged at the gate electrode of the semiconductor element. Therefore, only a small amount of electric charge is necessary during the former stage of the turn-off transition period. This shortens the duration of the former stage and suppresses the heat generation.

According to another feature of the invention, a voltage regulator of a vehicle AC generator is comprised of a semiconductor element for controlling current supplied to a field coil of the vehicle AC generator having a rectifier for rectifying generated AC output, a flywheel element connected in parallel with the field coil, generation voltage regulating means for controlling the semiconductor element to turn on or off so that an output voltage of the regulator can be regulated to a predetermined control voltage according to a signal that is related to the output voltage, and a switching capacity control circuit. The rectifier is characterized by comprising a diode formed of a diode of a short recovery time, the maximum current change rate (%) of the semiconductor element during the recovery period is less than twice as long as the maximum current change rate (%) during turn-off transition period or turn-on transition period of the semiconductor element.

When the semiconductor element turns off or turns on, while the return current flows, or while the AC output power is rectified by the rectifier, when the bias voltage of the diode changes from forward to backward, the recovery current of the diode can be controlled. Therefore, the spike voltage appearing on the charging line can be reduced so that the radio noises can be suppressed.

In addition, the change rate per unit time of the current of the semiconductor element when turning on is made less than twice as much as the current change rate of the recovery current of the diode of the rectifier. Therefore, the spike noise level on the charging line caused by the switching can be controlled at the diode-return current noise level, so that the spike voltage and the radio noises of the AC generator can be effectively suppressed.

In addition, the back recovery time shortening type diode has a lower breakdown voltage, and the breakdown voltage of the flywheel element can be set to be lower. Therefore, the recovery voltage of the flywheel element can be lowered, so that noises can be effectively suppressed.

BRIEF DESCRIPTION OF THE DRAWINGS

Other objects, features and characteristics of the present invention as well as the functions of related parts of the present invention will become clear from a study of the following detailed description, the appended claims and the drawings. In the drawings:

DETAILED DESCRIPTION OF THE PREFERRED EMBODIMENTS

Figure 1:
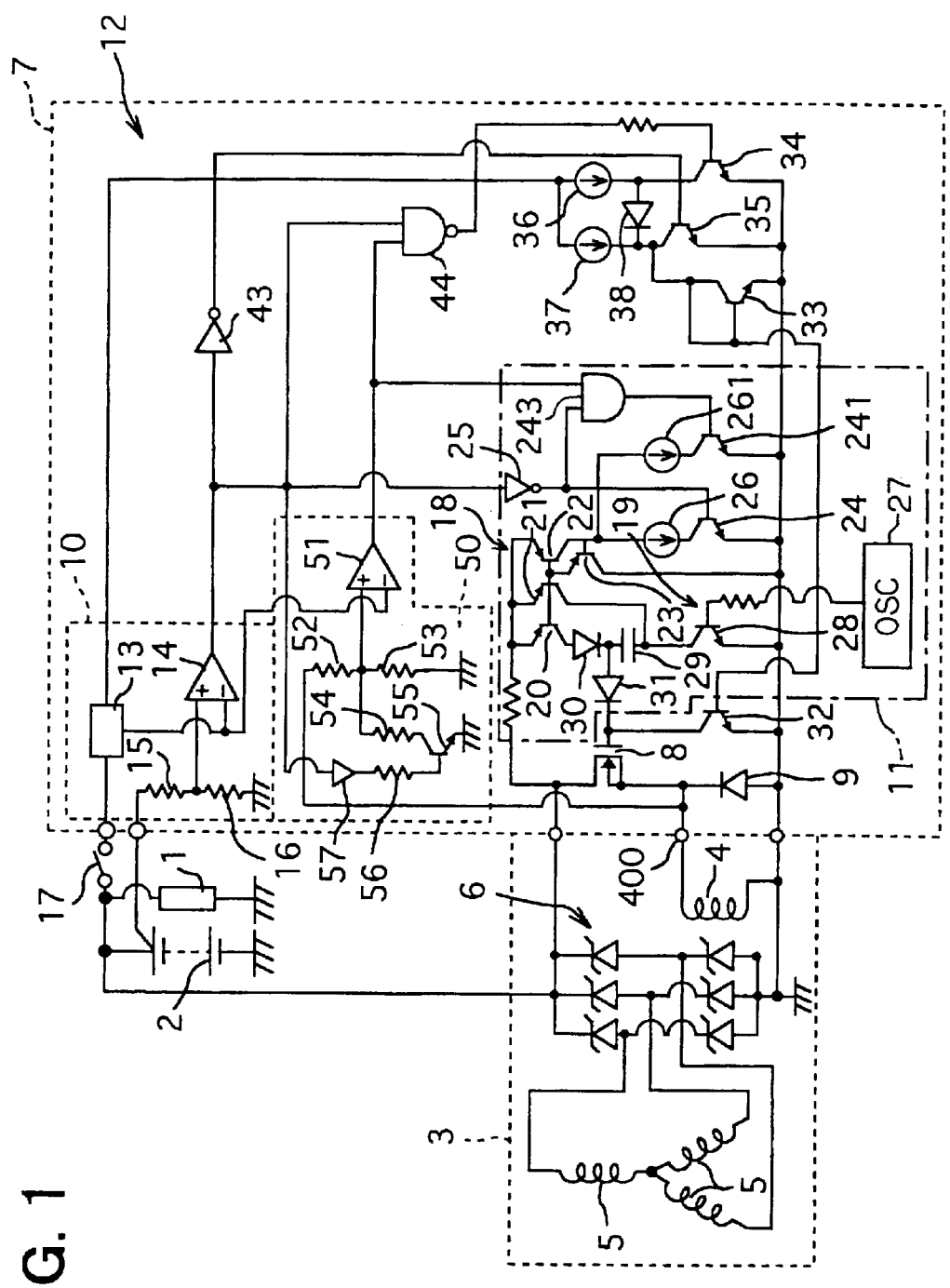
FIG. 1 is a circuit diagram of a voltage regulator of a vehicle AC generator according to a first embodiment of the invention.
Figure 2:
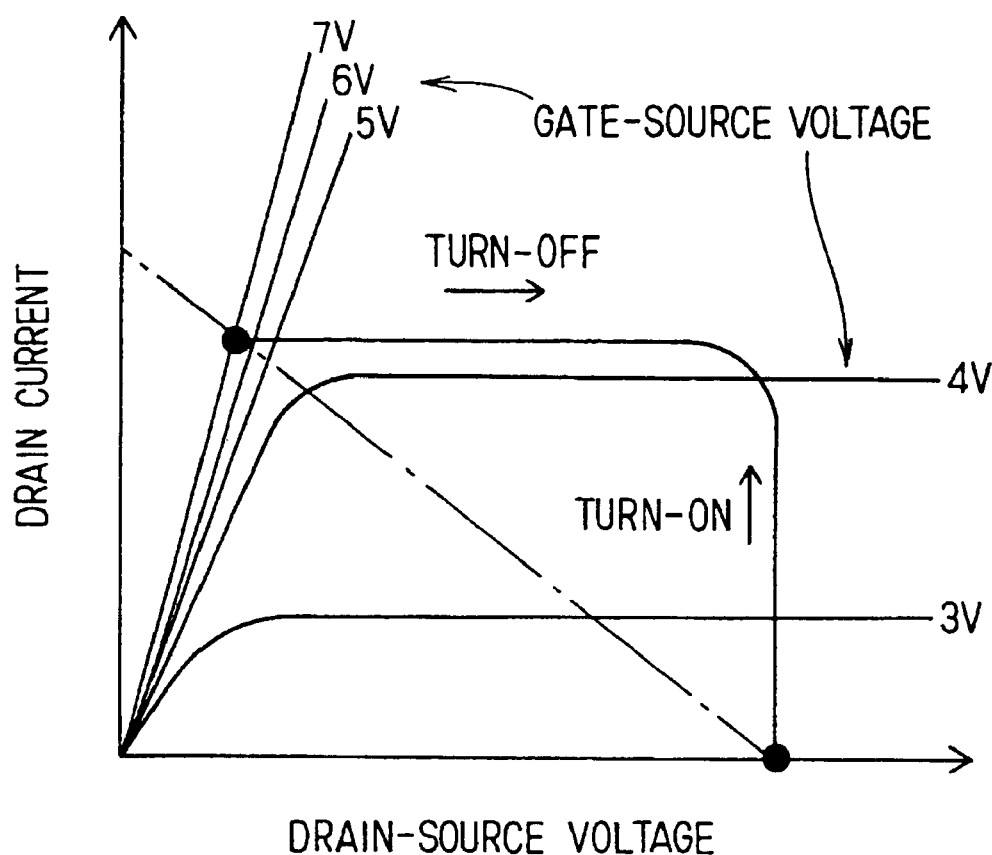
FIG. 2 is a graph showing characteristic curves of switching operation of a semiconductor element according to the first embodiment.
Figure 3A:
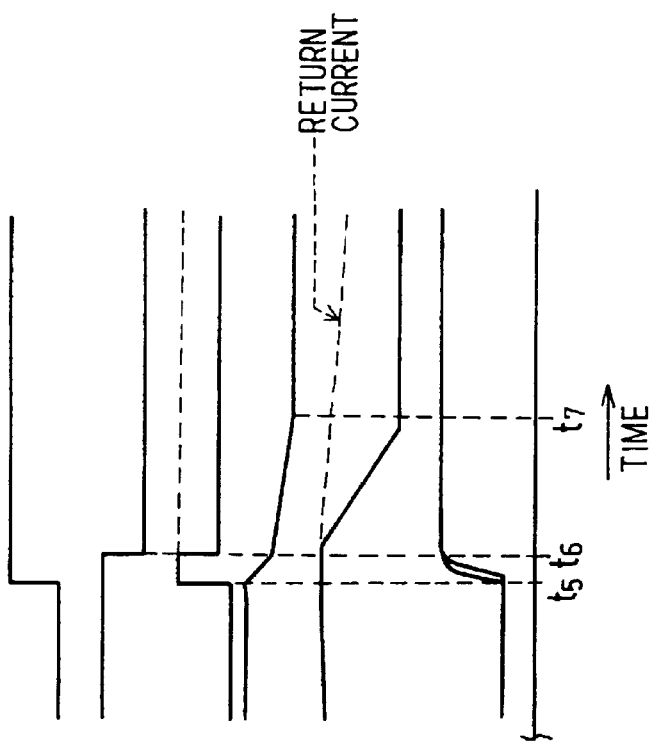
FIGS. 3A and 3B are timing charts showing switching operation of the semiconductor element.
Figure 3B:
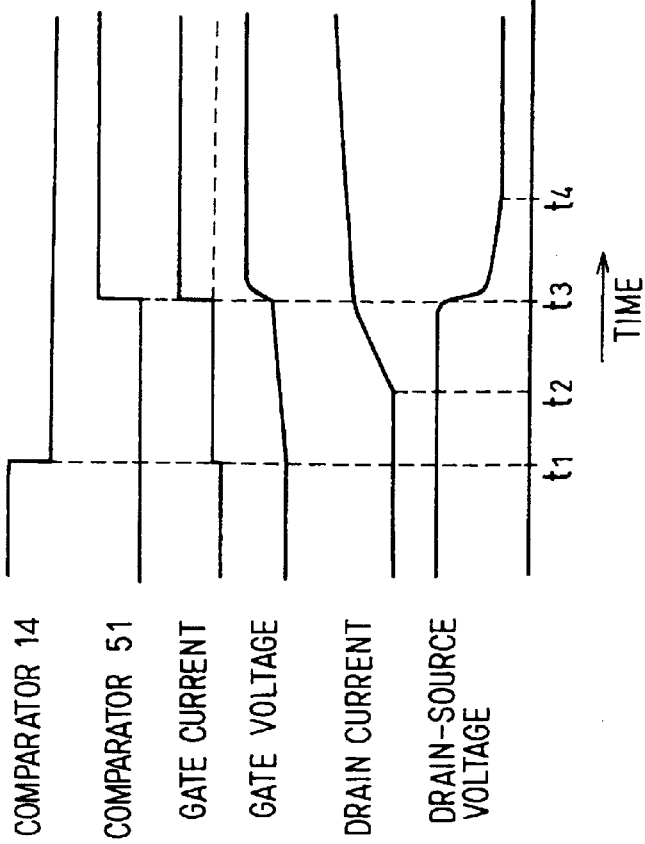

A voltage regulator of a vehicle AC generator according to a first embodiment of the invention is described with reference to FIGS. 1–3.

Vehicle electric load 1 is supplied with current from a battery 2. The battery 2 is charged by a vehicle AC generator 3 that is driven by an engine (not shown).

The AC generator 3 has a field coil 4 that provides magnetic field when it is supplied with current and an armature coil 5 that generates electromotive force when the magnetic field crosses it and changes. The field coil 4 or the armature coil 5 is rotated by the engine. AC output power of the armature coil 5 is rectified by a rectifier circuit 6 to DC output power, which is supplied to the electric load 1 and the battery 2.

The generation energy of the generator 3 or the armature coil 5 depends on the rotation speed of the generator 3 and an amount of the current supplied to the field coil 4. The current supplied to the field coil 4 is controlled by a voltage regulator 7.

The voltage regulator 7 has a semiconductor element 8, a flywheel diode 9, a battery-condition check-circuit 10, a semiconductor-element's terminal-voltage check-circuit 50, a charge pump circuit 11, a gate-discharge circuit 12 and a front stage transistor 32.

The semiconductor element 8 is made of a N-channel MOSFET. The flywheel diode 9 is connected in parallel to the field coil and to the semiconductor element 8 in the opposite polarity. A gate electrode of the semiconductor element 8 is discharged by the front stage transistor 32 and charged by the charge pump circuit 11, so that the semiconductor element 8 can be controlled. The front stage transistor 32 is controlled by the gate-discharge circuit 12. The gate discharge circuit 12 and the charge pump circuit 11 are controlled by the terminal voltage check circuit 50 and the battery condition check circuit 10.

The battery condition check circuit 10 increases or decreases the generation energy of the generator 3 according to the voltage of the battery 2. In other words, the circuit 10 decides whether to turn on or off the semiconductor element 8. The circuit 10 is comprised of a constant voltage circuit 13, a comparator 14 and a series circuit of resistors 15 and 16. The battery condition check circuit 10 compares a divided voltage of the battery 2 and a reference voltage provided by the constant voltage circuit 13 by the comparator 14 and provides a Hi-signal to turn off the semiconductor element 8 if the battery voltage is higher than the regulation voltage. On the other hand, the comparator 14 provides a Lo-signal to turn on the semiconductor element 8 if the battery voltage is lower than the regulation voltage.

The terminal voltage check circuit 50 detects the voltage of a terminal 400 of the field coil 4 that is connected to the semiconductor element 8 to check the voltage condition across the drain of the semiconductor element 8 and the source thereof and provides a switching signal for switching the charge-discharge current of the gate electrode of the semiconductor element 8 according to the check result. The terminal voltage check circuit 50 compares a divided voltage of the voltage of the terminal 400 and the reference voltage provided by the constant voltage circuit 13 by the comparator 51. If the divided voltage of the terminal 400 is higher than the reference voltage, the comparator 51 provides the Hi-signal. On the other hand, if the divided voltage of the terminal 400 is lower than the reference voltage, the comparator 51 provides the Lo-signal. The divided voltage of the terminal 400 is provided by a multi-dividing-ratio-type resistor-dividing circuit that is comprised of resistors 52–54, a transistor 55, a base-current-limiting resistor 56 and a buffer 57.

The multi-dividing-ratio-type resistor-dividing circuit operates as follows. When the transistor 55 turns on, the resistor 53 and the resistor 54 are connected in parallel to change the dividing ratio. In other words, if the battery voltage is higher than a regulation voltage, the transistor 55 is turned on by the Hi-signal sent from the buffer 57 that transmits the High-signal provided by the comparator 14. If the battery voltage is lower than the regulation voltage, the comparator 14 provides the Lo-signal, and the transistor 55 is turned off by the Lo-signal sent from the buffer 57. Accordingly, the dividing ratio increases when the transistor 55 is turned on and decreases when the transistor 55 is turned off.

A switch voltage of the terminal voltage check circuit 50 is set lower when the battery voltage is lower than the regulation voltage, resulting in turning on the semiconductor element 8 to make the potential of the terminal 400 high than when the battery voltage is higher than the regulation voltage, resulting in turning off the semiconductor element 8 to make the potential of the terminal 400 low.

The charge pump circuit 11 is a circuit for controlling the gate voltage of the semiconductor element 8 in response to the output signal of the battery condition check circuit 10, the output signal of the terminal voltage check circuit 50 and is comprised of a constant current supply circuit 18 and a current pump circuit 19. The constant current supply circuit 18 is a current mirror circuit that is comprised of transistors 20, 21 and 22. The current mirror circuit is controlled by a transistor 23.

The transistor 23 is controlled by a transistor 24 and a transistor 241. The transistor 24 is controlled to turn on or off by an inverted signal of the output signal of the comparator 14 of the battery condition check circuit 10. The transistor 241 is controlled to turn on or off by an AND circuit 243, whose input signals are an output signal of an inverter 25 and the output signal of the terminal voltage check circuit 50.

If the output signal of the comparator 14 of the battery condition check circuit 10 is the Lo-signal and the output signal of the comparator 51 of the terminal voltage check circuit is the Hi-signal, the transistor 241 turns on. The transistor 24 and the transistor 241 are supplied with current from the collector of the transistor 22 through a constant current circuit 26 and a constant current circuit 261, respectively. Accordingly, an amount of the charging current supplied to the semiconductor element 8 through diodes 30 and 31 by the current mirror circuit is controlled by the output signals of the circuits 10 and 50.

The current pump circuit 19 is comprised of an oscillator circuit 27 for providing fixed-cycle pulse-voltage, a transistor 28 that is controlled by the oscillation circuit 27 to turn on or off and a capacitor 29 for accumulating the electric charge, in response to turning-on-and-off of the transistor 28, to be supplied to the gate electrode of the semiconductor element 8.

Operation of the semiconductor element 8 when turning on is described hereafter.

When the semiconductor element 8 turns off and current supplied to the field coil 4 decreases, the battery voltage lowers. If the battery voltage becomes lower than the regulation voltage, the comparator 14 of the battery condition check circuit 10 provides the Lo-signal. Consequently, the transistor 24 is turned on by the Hi-signal provided by the inverter 25, and gate charging current controlled by the constant current circuit 26 is supplied to the gate electrode of the semiconductor element 8 through the diodes 30 and 31. The gate charging current gradually fills the capacity of the gate to increase the gate voltage. If the gate voltage becomes higher than a threshold value of the semiconductor element 8, the drain current of the semiconductor element increases.

As the gate voltage increases gradually, the drain current changes slowly, so that spike voltage and radio noises can be well prevented.

If the gate voltage further increases, the voltage across the drain of the semiconductor element 8 and the source thereof decreases, so that the voltage of the terminal 400 increases. Thereafter, if the divided voltage of the voltage of the terminal 400 becomes higher than the reference voltage of the comparator 51 (or the switch voltage), the comparator 51 of the terminal voltage check circuit 50 provides the Hi-signal. Consequently, the AND circuit 243 turns on the transistor 241, so that the amount of the constant current of the current mirror circuit becomes the sum of the currents of the constant current circuits 26 and 261, thereby increasing the charging current to be charged to the gate of the semiconductor element 8. As a result, the gate voltage of the semiconductor element 8 increases quickly, and the drain-source voltage of the semiconductor element 8 decreases quickly.

Although large drain current and high drain-source voltage increase heat generation while the semiconductor element is operating in the active range thereof, the heat energy, which is proportional to voltage×current×time, can be controlled because the gate voltage increases quickly in a short time. Thus, if the gate charging current is switched, it is preferable that the ratio of the charging current is about 20.

If the voltage of the terminal 400 becomes as high as the battery voltage, the gate of the semiconductor element 8 is supplied with a charge pump current (C×Vc×f) decided by the capacity C of the capacitor 29 of the pump circuit 19, the oscillation frequency f of the oscillation circuit 27 and the applied voltage Vc of the capacitor 29.

If the battery voltage is higher than the regulation voltage, the comparator 14 of the battery condition check circuit 10 provides the inverter 25 with the Hi-signal so that the circuit 11 stops charging the gate electrode of the semiconductor element 8. The Hi-signal of the comparator 14 is also inverted by the inverter 43 to turn off the transistor 35. Accordingly, the current of the constant current circuit 37 is supplied to the bases of the front stage transistor 32 and the transistor 33, which form the current mirror circuit, so that the front stage transistor 32 discharges the same amount of current from the gate electrode of the semiconductor element 8 as the current supplied by the constant current circuit 37.

Since the drain-source voltage is low at the former stage of the turn-off transition period, the voltage of the terminal 400 is high so that the comparator 51 of the terminal voltage check circuit 50 provides the Hi-signal. Accordingly, the Hi-signal is supplied from the comparator 14 of the battery voltage check circuit 10, and the Hi-signal is supplied from the comparator 51 of the terminal voltage check circuit 50 to a NAND circuit 44 of the gate discharge circuit 12 to turn off the transistor 34. Consequently, current from the constant current circuit 36 through the diode 38 and current from the constant current circuit 37 are supplied to the bases of the front stage transistor 32 and the transistor 33 so that the front stage transistor 32 discharges the current decided by the composite current of the constant current circuits 37 and 38 from the gate electrode of the semiconductor element 8 quickly. As a result, the gate voltage of the semiconductor element 8 lowers quickly, and the drain-source voltage of the semiconductor element 8 increases quickly. Although this process generates a large amount of heat per unit time, the heat generation can be suppressed by lowering the gate voltage in a short time.

If the drain-source voltage of the semiconductor element 8 increases, the voltage of the terminal 400 decreases. When the voltage of the terminal 400 becomes lower than the switch voltage, the comparator 51 of the terminal voltage check circuit 50 provides the Lo-signal to make the NAND circuit 44 turn on the transistor 34, so that the current flows from the constant current circuit 36 to the transistor 34. Accordingly, only the current of the constant current circuit 37 flows to the bases of the front stage transistor 32 and the transistor 33 of the current mirror circuit. Consequently, the discharge current from the gate electrode of the semiconductor element 8 decreases, and the gate voltage gradually lowers so that the drain current of the semiconductor element 8 gradually decreases. Thus, the drain-current-change rate decreases, so that spike voltage and radio noises can be suppressed. When the gate discharge current is changed, the ratio of the gate charging current is preferably about 20.

Here, the threshold value of the terminal 400 for changing the discharging current when turned off is set higher than that when turned on (i.e. the comparator 51 of the terminal voltage check circuit 50 has a hysteresis) to speed up the operation of the comparator 51 when turned off so that the semiconductor element 8 can be prevented from turning off while large discharging current is flowing from the constant current circuits 36 and 37. Preferably, there is about 1 volt hysteresis difference at the terminal 400 for stable operation.

Thus, the current change rate per unit time can be controlled when the semiconductor element 8 is turned off, and the terminal voltage of the semiconductor element 8 is changed quickly while the current change amount is small. As a result, the switching loss can be reduced.

Figure 4:
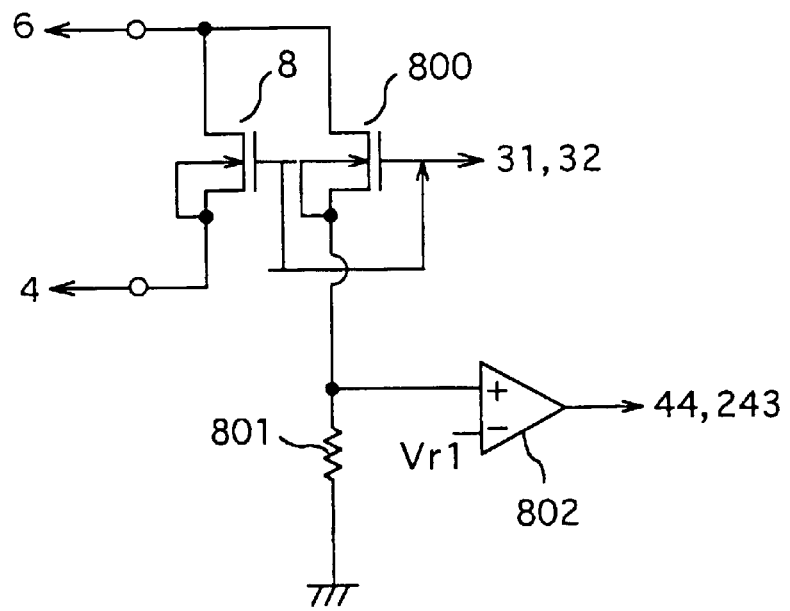
FIG. 4 is a circuit diagram of a voltage regulator according to a second embodiment of the invention.

A voltage regulator according to a second embodiment of the invention is described with reference to FIG. 4.

In the first embodiment, the terminal voltage check circuit 50 checks the voltage of the terminal 400 to detect the operation of the semiconductor element. On the other hand, the current supplied to the semiconductor element 8 is detected to control the charging or discharging current of the gate of a semiconductor element 800 according to an amount of the current.

The semiconductor element 800 is a transistor that forms a mirror circuit together with the semiconductor element 8 and conducts the same current as the semiconductor element 8. When the semiconductor element 8 turns on, the current that is proportional to the current of the semiconductor element 8 flows through a detecting resistor 801, thereby forming a voltage drop that corresponds to the current across the resistor 801. This voltage drop is compared by a comparator 802 with a reference voltage Vr1 to control the current change rate according to an amount of the current conducted thereby while the semiconductor element 8 turns on or off.

Since the semiconductor element 800 is a MOSFET forming a mirror circuit having a comparatively accurate mirror ratio, the current conducted by the transistor 8 is detected accurately.

Figure 5:
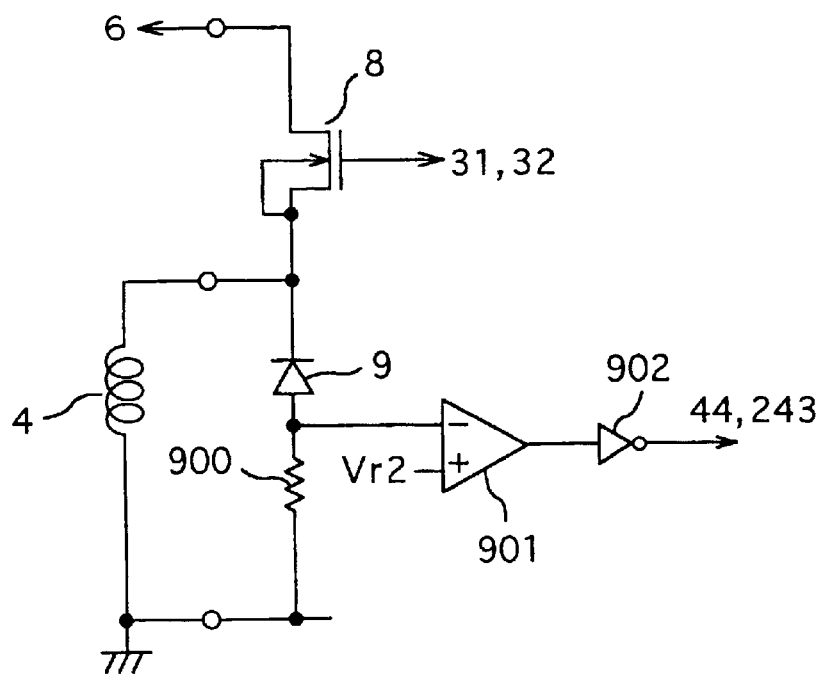
FIG. 5 is a circuit diagram of a voltage regulator according to a third embodiment of the invention.

A voltage regulator according to a third embodiment of the invention is described with reference to FIG. 5.

This invention, as in the second embodiment, instead of the terminal voltage check circuit 50, current flowing through a flywheel element when the semiconductor element 8 turns off is detected so as to control the charge and discharge current of the gate of the semiconductor element 8.

A detection resistor 900 detects return current flowing through the flywheel element 9. A voltage drop that corresponds to an amount of the return current appears across the resistor 900. The voltage drop is compared with a reference voltage Vr2 by a comparator 901 to control the current change rate per unit time when the semiconductor element 8 turns on and off. The flywheel element 9 can be comprised of the same MOSFET as the semiconductor element 8 forming a mirror circuit together with the semiconductor element 8 to cooperate together to detect the current.

In more detail, when the semiconductor element 8 turns on, the return current flowing through the flywheel element 9 decreases and the current flowing through the semiconductor element 8 increases. Accordingly, while the return current flows and the return current check circuit detects this return current, the charging current of the semiconductor element 8 is controlled, thereby controlling the current change rate per unit time of the current flowing through the semiconductor element 8.

When turning off, the current conducted by the semiconductor element 8 decreases, and the return current conducted by the flywheel element 9 increases, so that the discharge current of the semiconductor element 8 can be controlled and the current change rate per unit time can be controlled.

In this embodiment, the current change can be detected accurately during the transition periods in which the semiconductor element 8 turns on or off.

Figure 6:
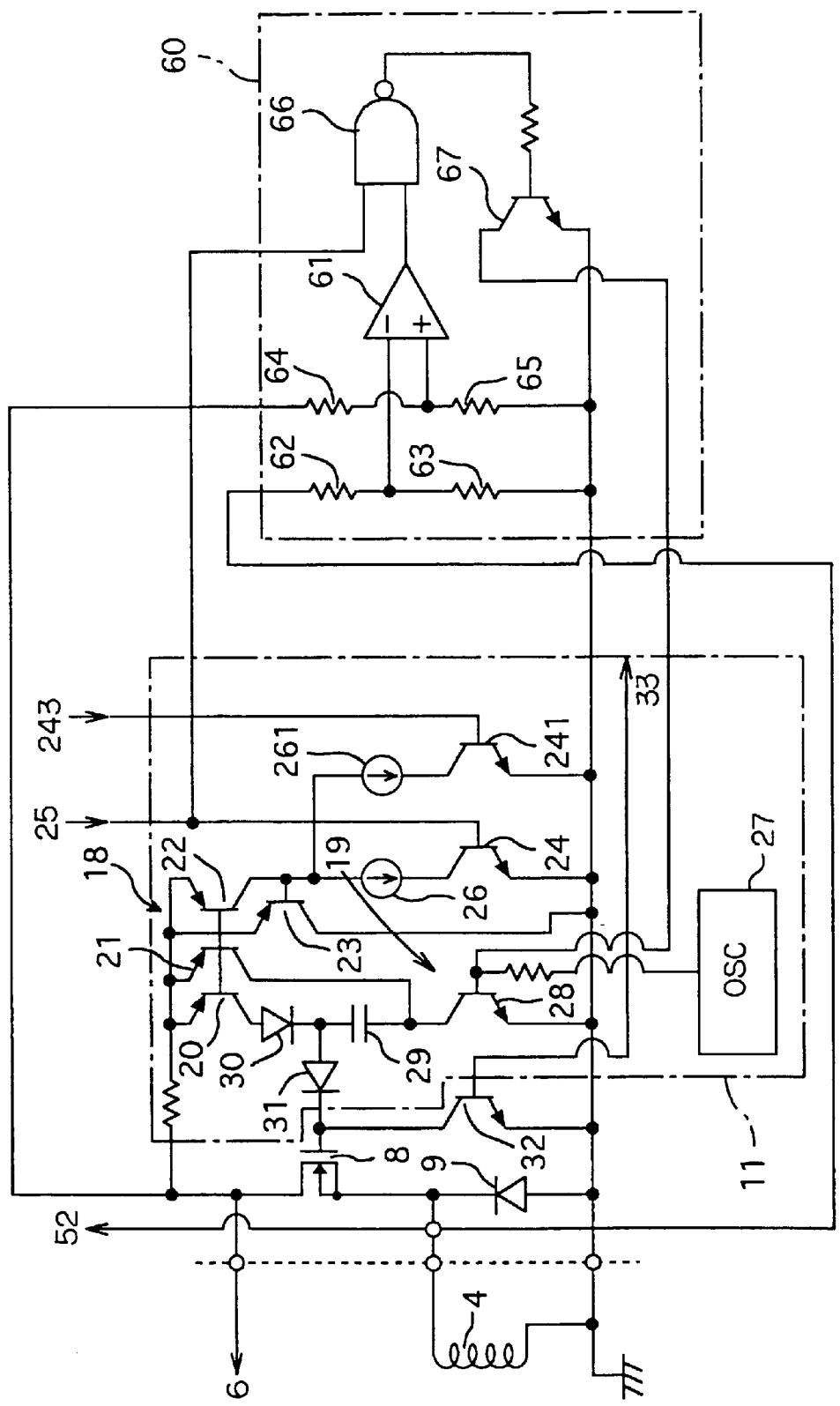
FIG. 6 is a circuit diagram of a voltage regulator according to a fourth embodiment of the invention.

A voltage regulator according to a fourth embodiment of the invention is described with reference to FIG. 6.

In the first embodiment, pulsating of the current is caused by the charge pump current and the voltage across the semiconductor element 8 becomes sufficiently low when the voltage the semiconductor element 8 turns on. This invention is to reduce the pulsation by stopping the oscillation of the charge pump circuit.

Operation of the charge pump circuit is described next.

Resistors 62 and 63, which form a resistor voltage-dividing-circuit, divide the voltage at the joint of the semiconductor element 8 and the field coil 4 to be inputted to a negative input terminal of a comparator 61. Resistors 64 and 65, which form another resistor voltage-dividing-circuit, divide the voltage at the joint of the semiconductor element 8 and the battery 2 to be inputted to a positive input terminal of the comparator 61. The comparator 61 compares the voltages applied to both the input terminals to check the condition of the semiconductor element 8. If the Hi-signal is inputted to a NAND circuit 66 from the inverter 25, the comparator 61 provides the NAND circuit 66 with the Hi-signal as long as the gate-source voltage of the semiconductor element 8 has not increased very much and the voltage across the semiconductor element 8 is high. Consequently, the NAND circuit 66 sends a transistor 67 the Lo-signal so that the transistor 67 turns off. Since the output signal of the oscillation circuit 27 is inputted to the transistor 28, the gate voltage of the semiconductor element 8 is boosted by the charge pump operation.

If the gate voltage of the semiconductor element 8 becomes much higher, the turn-on voltage (voltage drop) of the semiconductor element 8 becomes lower, so that the comparator 61 reverses the output signal and inputs the Lo-signal to the NAND circuit 66. Consequently, the NAND circuit 66 sends the Hi-signal to the transistor 67 to turn on. Accordingly, the signal of the oscillation circuit 27 is not inputted to the base of the transistor 28, and the charge pump operation is stopped. The same operation is carried out when the inverter 25 provides the Lo-signal, and the semiconductor element 8 turns off.

Figure 7A:
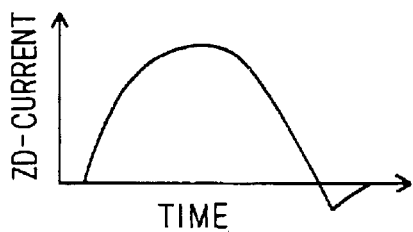
FIG. 7A is a timing chart showing current change of a Zener diode used in a voltage regulator according to a fifth embodiment of the invention.
Figure 7B:
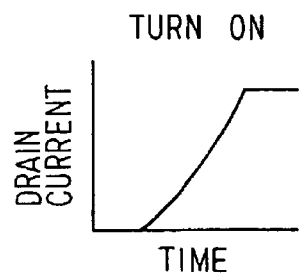
FIG. 7B is a timing chart showing drain-current change when the semiconductor element turns on and FIG. 7C is a timing chart showing drain-current change when the semiconductor element turns off.
Figure 7C:
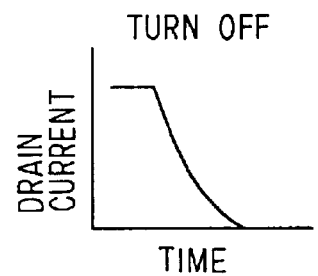

A voltage regulator according to a fifth embodiment of the invention is described with reference to FIG. 7.

Figure 8:
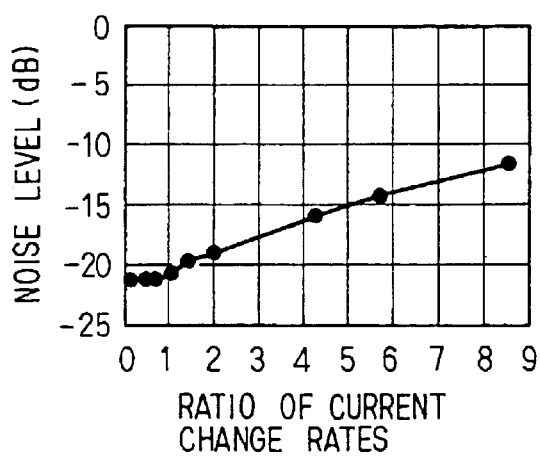
FIG. 8 is graph showing a relationship between noise levels and ratios of current change rate when the Zener diode turns on to current change rate when the Zener diode turns off.

This invention adopts Zener diodes, which needs smaller recovery current than junction type diodes, for the rectifier 6. Here, the current change rate per unit time of the semiconductor element 8 is set less than two times as large as the current change rate per unit time of the recovery current of the Zener diodes. In other words, noise level of the switching operation of the semiconductor element 8 is reduced to a noise level caused by the recovery current of the rectifier 6 (the difference is less than about 3 db as shown in FIG. 8). According to this invention, turn-on and turn-off of the semiconductor element 8 during the switching transition period are not too much controlled, thereby assuring stable switching operation.

In the above embodiments, the semiconductor element 8 is used as a high-side element. It can be used as a low-side element too.

In the foregoing description of the present invention, the invention has been disclosed with reference to specific embodiments thereof. It will, however, be evident that various modifications and changes may be made to the specific embodiments of the present invention without departing from the scope of the invention as set forth in the appended claims. Accordingly, the description of the present invention is to be regarded in an illustrative, rather than a restrictive, sense.

What is claimed is:

1. A voltage regulator of a vehicle AC generator including a field coil and a rectifier for rectifying generated AC output, said voltage regulator comprising:

a semiconductor element connected to said field coil for controlling current supplied to said coil, said semiconductor element having a variable current switching capacity and a turn-off transition period before it is fully turned off;

a flywheel element connected in parallel with said field coil;

generation voltage regulating means for controlling said semiconductor element to turn on or off so that an output voltage of said rectifier can be regulated to a regulated voltage according to a signal related to said output voltage; and switching capacity control means for controlling the current-switching capacity during a former stage of the turn-off transition period of said semiconductor element to be larger than the current switching capacity during a latter stage of the turn-off transition period.

2. The voltage regulator of a vehicle AC generator according to claim 1, wherein said switching capacity control means changes one of control voltage and control current of said semiconductor element at an approximately fixed change rate during said former stage of said turn-off transition period and the latter stage, and said change rate at the former stage is set larger than the change rate at the latter stage.

3. The voltage regulator of a vehicle AC generator according to claim 2, wherein said semiconductor element carries out a follower operation.

4. The voltage regulator of a vehicle AC generator according to claim 1, further comprising:

a comparator for comparing a signal voltage related to a voltage drop of main electrodes of said semiconductor element with a reference value; and said switching capacity control means decreases a decrease rate of the current switching capacity of the control electrode of said semiconductor element to a smaller value right after said signal voltage becomes said reference value during said turn-off transition period.

5. The voltage regulator of a vehicle AC generator according to claim 4, wherein said comparator increases charging current of a gate electrode of said semiconductor element, right after said signal voltage becomes said reference value during the turn-on transition period of said semiconductor element; and said reference value for changing said charging current during said turn-on transition period is set lower than a predetermined value for changing said charging current during said turn-off transition period.

* * * * *